(12) United States Patent
Shklover et al.

(10) Patent No.: US 7,629,572 B2
(45) Date of Patent: Dec. 8, 2009

(54) OPTICAL DEVICES AND RELATED SYSTEMS AND METHODS

(75) Inventors: Vitaliy Shklover, Konigsbronn (DE); Holger Kierey, Aalen (DE); Holger Muenz, Aalen (DE); Michel Le Maire, Oberkochen (DE); Bernhard Weigl, Steinheim (DE)

(73) Assignee: Carl Zeiss Laser Optics GmbH, Oberkochen (DE)

( * ) Notice: Subject to any disclaimer, the term of this patent is extended or adjusted under 35 U.S.C. 154(b) by 439 days.

(21) Appl. No.: 11/418,872

(22) Filed: May 5, 2006

(65) Prior Publication Data
US 2008/0272275 A1 Nov. 6, 2008

Related U.S. Application Data

(60) Provisional application No. 60/731,313, filed on Oct. 28, 2005.

(51) Int. Cl.
*G01J 1/32* (2006.01)
*G02B 13/08* (2006.01)

(52) U.S. Cl. .................. 250/234; 359/668
(58) Field of Classification Search .......... 250/234, 250/235, 236; 359/668, 669, 670, 671; 362/259, 362/268; 235/462.35
See application file for complete search history.

(56) References Cited

U.S. PATENT DOCUMENTS

| | | | | |
|---|---|---|---|---|
| 5,721,416 A * | 2/1998 | Burghardt et al. | ...... | 219/121.73 |
| 5,967,645 A * | 10/1999 | Anderson | ..... | 362/259 |
| 6,433,934 B1 * | 8/2002 | Reznichenko et al. | ...... | 359/622 |
| 6,688,758 B2 * | 2/2004 | Thibault | ..... | 362/368 |
| 6,754,007 B2 * | 6/2004 | Yamakawa et al. | ..... | 359/668 |
| 6,773,142 B2 * | 8/2004 | Rekow | ..... | 362/259 |
| 6,844,272 B2 * | 1/2005 | Taylor et al. | ..... | 438/787 |
| 7,016,393 B2 * | 3/2006 | Anikitchev et al. | ..... | 372/101 |
| 7,199,946 B2 * | 4/2007 | Jeong | ..... | 359/726 |
| 2002/0171028 A1 * | 11/2002 | Feldman | ..... | 250/201.2 |
| 2003/0128543 A1 * | 7/2003 | Rekow | ..... | 362/259 |
| 2004/0061868 A1 * | 4/2004 | Chapman et al. | ..... | 356/503 |

(Continued)

OTHER PUBLICATIONS

Knowles, D.S. et al., "Thin Beam Crystallization Method: A New Laser Annealing Tool with Lower Cost and Higher Yield for LTPS Panels", SID Digest (2005), (May 2005).

(Continued)

*Primary Examiner*—John R Lee
(74) *Attorney, Agent, or Firm*—Fish & Richardson P.C.

(57) ABSTRACT

The disclosure relates to a light beam intensity non-uniformity correction device that includes an optical element having a light entrance face with an antireflective property. According to the invention the antireflective property is locally amended in order to enhance light beam intensity uniformity. The disclosure further relates to a method for amending intensity distribution of a light beam in an optical system having one or more optical elements, where the method includes: a) assembling the optical system with the one or more optical elements arranged in predetermined positions, b) measuring intensity distribution, c) calculating locally required increase or decrease in absorption and/or reflection of one of the optical elements to amend measured intensity distribution into a predetermined intensity distribution, d) removing the optical element from the optical system, e) locally amending absorption and/or reflection of the one of the optical elements according to the calculation, f) installing the optical element in the predetermined position in the optical system.

22 Claims, 8 Drawing Sheets

U.S. PATENT DOCUMENTS

| | | | |
|---|---|---|---|
| 2004/0169836 A1* | 9/2004 | Wegmann .................... | 355/67 |
| 2005/0088746 A1* | 4/2005 | Yoshikawa et al. .......... | 359/569 |
| 2006/0176912 A1* | 8/2006 | Anikitchev .................... | 372/9 |
| 2006/0221459 A1* | 10/2006 | Sagan ........................ | 359/668 |
| 2007/0024764 A1* | 2/2007 | Chung ........................ | 348/745 |
| 2008/0117518 A1* | 5/2008 | Wang et al. ................. | 359/618 |
| 2008/0272275 A1* | 11/2008 | Shklover et al. ............ | 250/205 |

OTHER PUBLICATIONS

Park, Ji-Yong et al., "Thin Laser Beam Crystallization method for SOP and OLED application", SID Digest (2005) and in TCZ GmbH Company brochure entitled "LCD Panel Manufacturing Moves to the next Level-Thin-Beam Directional 'Xtallization (TDX) Improves Yield, Quality and Throughput for Processing Poly-Silicon LCDs", (May 2005).

* cited by examiner

OPTICAL DEVICES AND RELATED SYSTEMS AND METHODS

CROSS-REFERENCE TO RELATED APPLICATION

This application claims the benefit under 35 U.S.C. §119 (e)(1) of U.S. Provisional Application No. 60/731,313, filed Oct. 28, 2005, the contents of which are hereby incorporated by reference.

FIELD

The disclosure relates to a light beam intensity non-uniformity correction device that includes an optical element having a light entrance face with an antireflective property. The optical element can have at least one face covered with an anti-reflective coating. The disclosure further relates to a method for amending intensity distribution of a light beam in an optical system having one or more optical elements. The method can correct light beam intensity non-uniformity. The disclosure also relates to an anamorphic optical system for generating a sharp illuminating line on a surface, where the illuminating line can have a high aspect ratio and a cross-section with long and short axes. The disclosure relates to a scanning system for producing a scanning illuminating line on a surface, where the illuminating line has a high aspect ratio and a cross-section with long and short axes.

BACKGROUND

For many optical applications a predetermined intensity distribution of a light beam is desirable. In particular in some cases even a very high uniformity of the light beam is desirable. An example where an intensity profile with very high uniformity is desirable is the so-called light induced crystallization processes where a thin and long laser beam is scanned over a thin non-crystalline thin film, i.e. an amorphous layer. These crystallization procedures are well known as excimer laser crystallization (ELC), sequential lateral solidification (SLS) or thin beam crystallization procedure (TDX). An overview of these different fabrication procedures is e.g. given by D. S. Knowles et al. "Thin Beam Crystallization Method: A New Laser Annealing Tool with Lower Cost and Higher Yield for LTPS Panels" in SID 05 Digest; Ji-Yong Park et al. "Thin Laser Beam Crystallization method for SOP and OLED application" in SID 05 Digest and in a brochure of the TCZ GmbH Company entitled "LCD Panel Manufacturing Moves to the next Level-Thin-Beam Directional 'Xtallization (TDX) Improves Yield, Quality and Throughput for Processing Poly-Silicon LCDs".

In an optical system, consisting of a plurality of optical elements (as is the case for a laser annealing apparatus for carrying out such crystallization procedures), imperfections of the individual optical elements contribute to the total intensity and phase non-uniformity of the system.

Since the errors of individual components cannot be reduced arbitrarily, the total imperfection measured in the whole system is usually corrected at a certain individual element. In such sophisticated applications like optical and (extreme ultraviolet) EUV microlithography phase errors are locally corrected at one individual element by means of an ion beam figuring method (ion beam milling, ion beam etching) or by any kind of mechanical polishing, particularly computer-controlled polishing.

SUMMARY OF THE INVENTION

In some embodiments, the light beam intensity non-uniformity correction device includes an optical element having a light entrance face with a certain antireflective property. The antireflective property is locally amended in such a manner that the intensity uniformity of a light beam hitting the entrance face and e.g. transmitting the light beam intensity non-uniformity correction device is enhanced after having left the light beam intensity non-uniformity correction device.

The light entrance face of the light beam intensity non-uniformity correction device can have a uniform base antireflective property which is locally out of tune. While the antireflective property as such can prevent incoming light from being scattered and not being usable any more, the local maladjustment can eliminate locally undesired increased light intensities resulting in an improved homogenization of the light beam and therefore to an enhanced intensity uniformity.

In certain embodiments, the optical element is covered by an antireflective coating. The antireflective coating forms the entrance face. Any local amendment of the anti-reflective coating can result in an increased or decreased local reflectivity at the entrance surface. Locally amending the properties of the anti-reflective coating in a predetermined manner may serve for improving intensity uniformity of an incoming light beam.

Despite any amendment of the anti-reflective coating may serve to increase intensity uniformity preferably the thickness of the antireflective coating is locally varied or amended, respectively, in order to achieve desired uniformity enhancement properties.

While local thickness variations may be provided during manufacturing process, e.g. deposition process, of the anti-reflective coating, most preferably material of the antireflective coating is locally removed. It is not necessary that the entire anti-reflective coating is removed locally in order to achieve the desired uniformity correction but only a fraction of the thickness may be abraded locally.

For some applications it may be sufficient when the anti-reflective coating is formed by only one single layer. For performance reasons the antireflective coating preferably comprises tow or more, namely a plurality of layers, i.e. a multilayer structure.

It has been found that in most cases the best results with respect to the desired performance of the light beam intensity non-uniformity correction device may often be achieved when only the outer layer of the plurality of layers is locally at least partly removed. Details will be described in the following when referring to the drawings enclosed.

The local abrasion of the antireflective coating, in particular the outer layer of the anti-reflective coating may be carried out by mechanical treatments such as polishing or chemical treatments such as etching. Nevertheless, for performance reasons ion beam figuring, i.e. ion beam milling or ion beam etching, preferably may be used.

The light beam intensity non-uniformity correction device may not only incorporate intensity non-uniformity correction properties but also any other beam error correcting properties. In particular, the light beam intensity non-uniformity correction device may comprise a setup for wave front non-uniformity correction. Such a wave front non-uniformity correction setup may be manufactured following the solutions described in, for example, US 2004/0169836 A1, U.S. Pat. No. 6,844,272 B2 and US 2004/0061868 A1. Furthermore, the light beam intensity non-uniformity correction device may also form a field curvature correction device or in particular a line focus correction device as e.g. disclosed in U.S. Provisional Application No. 60/731,313, filed Oct. 28, 2005 and which is herewith incorporated by reference. The light beam intensity non-uniformity correction device disclosed herein can be incorporated into an anamorphic system. Such systems generally can involve a relatively precise local attribution of the correction of imperfections as compared to rotational symmetric systems such as lithographic setups. Typically, no increase of intensity uniformity may be achieved by rotating the optical element being an anamorphic imaging element.

The anamorphic imaging element used for uniformity correction may be a cylindrical lens or a plane window or even a cylindrical mirror.

A light beam intensity non-uniformity correction device as described above may be part of an optical system, in particular an anamorphic optical system or a scanning system.

In some embodiments, a method is provided for amending intensity distribution (e.g., for light beam intensity non-uniformity correction in an optical system having one optical element or a plurality of optical elements).

The method according can include: 1.) assembling an optical system with the optical elements being substantially arranged in predetermined positions; 2.) measuring the intensity distribution, e.g. the intensity uniformity, in the target plane with locally resolved determination; 3.) calculating a locally desired increase or decrease in absorption and/or reflection of (at least) one of the optical elements in order to amend measured intensity distribution into a predetermined intensity distribution (a preferred predetermined intensity distribution can be an intensity uniformity in a specific target region); 4.) removing the (at least) one of the optical elements is removed from the optical system (the third and fourth steps may also be exchanged in sequence); 5.) locally amending absorption and/or reflection of the (at least) one of the optical elements according to the calculation done in the third step; 6.) re-installing the (at least) one of the optical elements in the predetermined position in the optical system.

Typically, the intensity distribution is measured in a field plane or a conjugate plane thereof. Measuring the intensity distribution in a field plane or a conjugate plane thereof, and in particular in the target plane has the advantage that it is quite easy to determine the locations where the corrections are to be done on the (at least) one of the optical elements.

It can be advantageous to measure the intensity distribution simultaneously or successively for a plurality of field points or conjugate field points. The simultaneous measurement in general requires a respective detector in the form of an array, such as a photodiode array (PDA), a charge coupled device CCD camera etc. A successive measurement may e.g. be performed by scanning a single detector or a line detector over the field plane. Such a detector may be a photodiode, a photomultiplier, a one-dimensional PDA, a line camera etc.

As has been already outlined with respect to the light beam intensity non-uniformity correction device described above the reflectance or the absorption of the one of the optical elements may be amended by locally adjusting an antireflective property of a light entrance face of the one of the optical elements.

Typically, the one of the optical elements has a light entrance face with a uniform base antireflective property. According to the invention the antireflective property is locally amended in order to become out of tune. This local amendment may either lead to an increased local scattering of the input light beam resulting in a decrease of intensity in the respective area and/or to an increased local absorption of the input light beam resulting also in a decrease of intensity in the respective area.

A preferred method according includes the selecting of the one of the optical elements having the antireflective property being determined by an antireflective coating. Amending antireflective properties locally may easily achieved by means of locally using different materials or by adjusting the local thickness of the antireflective coating. The latter may be achieved by locally at least partly removing the antireflective coating or by locally depositing some more material.

In some embodiments, an optical system has an optical element with an antireflective coating that includes a plurality of layers. A plurality of layers, i.e. multilayer-structures, are used when the reflectance has to be reduced as far as possible and only a minor reflectance is tolerable.

In certain embodiments, only the outer layer of the plurality of layers is thinned locally. This means in other words that only the outer layer of the multi-layer-structure is locally and at least partly removed.

As a manufacturing method for abrasion of parts of the outer layer ion beam figuring such as ion beam etching or ion beam milling may be used more preferably than local mechanical abrasion such as polishing and also more preferred than chemical treatments such as etching procedures.

In some embodiments, the method includes:
  i. assembling the optical system with the optical elements being arranged in predetermined positions
  ii. measuring wave front distribution
  iii. calculating locally required wave front correction of one of the optical elements in order to amend measured wave front distribution into a predetermined wave front distribution
  iv. removing the one of the optical elements from the optical system
  v. locally correcting properties of the one of the optical elements according to the calculation
  vi. installing the one of the optical elements in the predetermined position in the optical system Steps i., iv. and vi. may correspond to the first, fourth and sixth step mentioned above. The other steps may be performed simultaneously, subsequently or intermittingly with the respective second and third step (ii. and iii.) and fifth step (v.), respectively.

Furthermore, the method may further include:
  1) assembling the optical system with the optical elements being arranged in predetermined positions
  2) measuring focus position with respect to a predetermined field plane or a conjugate plane thereof
  3) calculating locally required focus position correction of one of the optical elements in order to amend measured focus position into a predetermined focus position
  4) removing the one of the optical elements from the optical system
  5) locally correcting properties of the one of the optical elements according to the calculation
  6) installing the one of the optical elements in the predetermined position in the optical system.

Steps 1), 4) and 6) may correspond to the first, fourth and sixth step as well as to steps i., iv. and vi., respectively. The other steps may be performed simultaneously, subsequently or intermittingly with the respective second and third step and the step ii. and iii. (step 2) and step 3)) as well as with the fifth step or step v. (step 5)), respectively.

In some embodiments, an anamorphic optical system for generating a sharp illuminating line on a surface is provided whereby the shape of the illuminating line is very close to a predetermined shape.

The illuminating line of the anamorphic optical system, which preferably may be a laser material processing apparatus and most preferably an apparatus for thin beam directional crystallization of silicon, has a high aspect ratio (e.g. 30,000, preferably more than 100,000, most preferably more than 150,000) and a cross-section with long and short axes. The anamorphic optical system comprises a plurality of optical elements. At least one of the optical elements can be an imaging error correction device.

The imaging error correction device may include a wave front correction device and in particular a surface figure error correction device.

Furthermore, the anamorphic optical system the imaging error correction device may include a light beam intensity non-uniformity correction device.

Additionally the anamorphic optical system may include a line focus correction device.

In some embodiments, a scanning system for generating a sharp illuminating line on a surface is provided whereby the shape of the illuminating line is very close to a predetermined shape.

The illuminating line of the scanning system for producing a scanning illuminating line on a surface according to the invention has a high aspect ratio of e.g. 30,000 or more and a cross-section with long and short axes. The scanning system comprises a plurality of optical elements, whereby at least one of the optical elements is an imaging error correction device.

The imaging error correction device can include a wave front correction device, such as the type disclosed in, for example, U.S. Pat. No. 6,844,272 B2.

The imaging error correction device may include a surface figure error correction device.

The imaging error correction device may also include a light beam intensity non-uniformity correction device.

The imaging error correction device furthermore or alternatively may include a line focus correction device one of which is, such as described in U.S. Provisional Application No. 60/731,313.

Systems and methods disclosed herein can provide a light beam intensity non-uniformity correction device being capable of correcting intensity non-uniformities having variations up to 15% and the manufacturability of which is quite easy and therefore not expensive. The light beam in this case means not only visible light but also electromagnetic radiation from the far infrared to the very extreme ultraviolet spectral range, e.g. radiation frequencies between 0.15-11 µm, such as between 0.19-1.1 µm.

Systems and methods disclosed herein can be useful, for example, in annealing of large substrates, in the field of light (e.g. laser) induced crystallization of substrates, in the field of flat panel displays, such as liquid crystal displays (LCD) (for example: thin film transistor displays (TFT) etc.) or luminescence displays (inorganic or organic light emitting diodes (LED, OLED), electroluminescence (EL) displays) and related manufacturing processes. Such systems and methods can also be used for the fabrication of thin film photovoltaic devices. In some embodiments, the systems and methods can be useful for laser light-induced crystallization of amorphous Silicon (a-Si) films forming polycrystalline Silicon (p-Si).

BRIEF DESCRIPTION OF THE DRAWINGS

The invention will be described further, by manner of example, with reference to the accompanying drawings, in which.

DETAILED DESCRIPTION

The description includes an anamorphic optical system which is capable for laser crystallization of an amorphous silicon layer.

Figure 1:
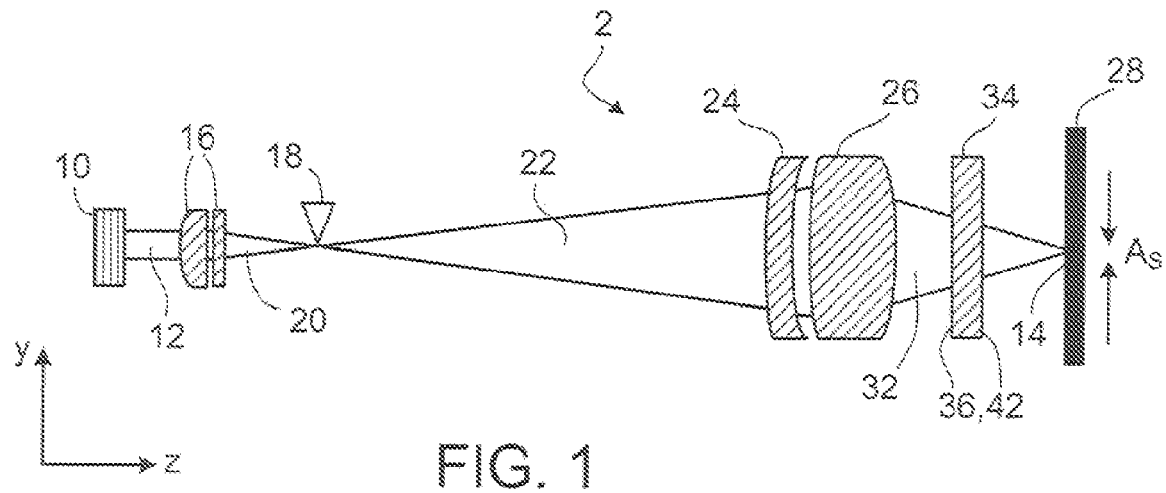
FIG. 1 is a diagrammatic presentation of an anamorphic optical system according to the invention for producing a sharp illuminating line and illustrating the beam path for generating the so-called short beam axis.
Figure 2:
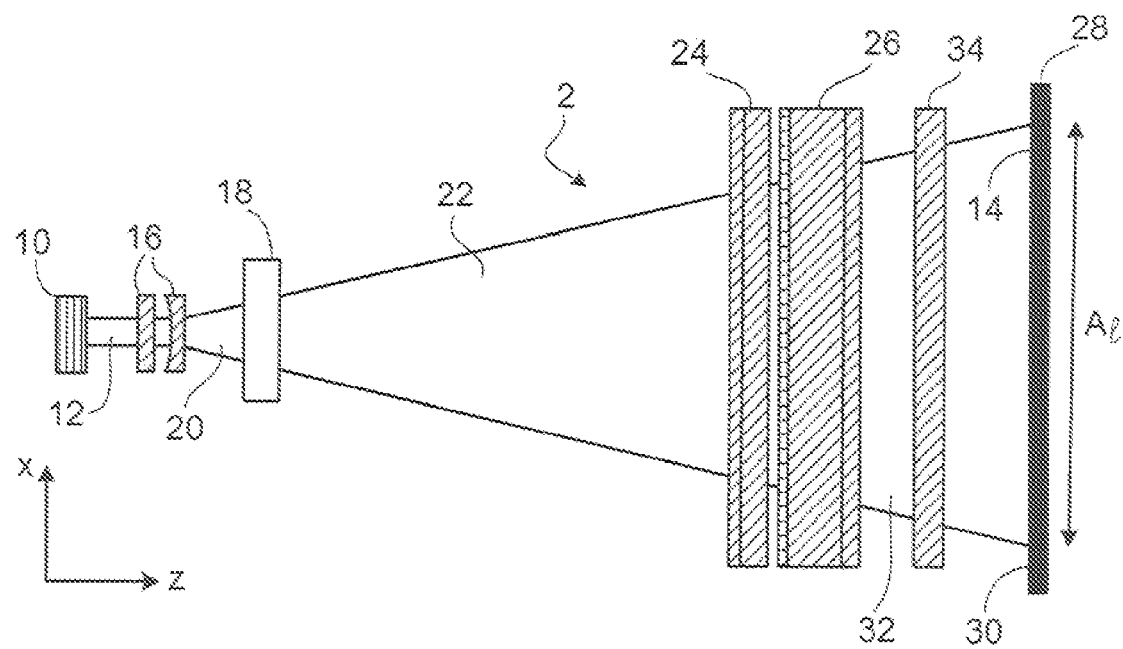
FIG. 2 is a diagrammatic presentation of the anamorphic optical system according to FIG. 1 illustrating the beam path for generating the long beam axis of the illuminating line.

Such an optical system is illustrated in FIGS. 1 and 2 and therein marked with the reference number 2. This optical system 2 comprises an excimer laser 10 which emits a pulsed beam 12 in per se known manner in z-direction. The dimensions of the excimer laser beam 12 emitted, for instance, may be 15 times 40 mm (in the xy-plane). The excimer laser 10 may preferably emit radiation in the spectral range between 130 nm and 390 nm. Instead of an excimer laser also a pulsed $CO_2$-laser, a diode laser, a solid state laser or a frequency doubled solid state laser may be used.

This laser beam is imaged by means of the optical system 2 which will be specified below to yield an illuminating line 14 in a field plane 30.

The laser beam 12 emitted by the excimer laser 10 first passes an attenuator (not shown), if desired, and then enters a set of anamorphic cylindrical lenses 16. The optical system 2 according to FIGS. 1 and 2, on the whole, is an anamorphic system in the sense that the imaging of the laser beam 12 in the directions of the long and short axes, respectively, takes place largely independently. An example for such an anamorphic system and in particular a typical set of anamorphic cylindrical lenses 16 is shown in U.S. Pat. No. 5,721,416.

To obtain the so-called short axis $A_s$ of the illuminating line 14 (i.e. to reduce the beam diameter to the width of the illuminating line of, typically, 5 to 10 μm), first of all, as shown in FIG. 1, a field limiting element 18 is illuminated with the laser beam 20 generated by the set of cylindrical lenses 16. This field limiting element 18 may be illuminated homogeneously in efficient manner (i.e. making the best possible use of the radiation energy supplied by the laser 10). Nevertheless, the field limiting element 18 may also be illuminated deviating from a homogeneous manner dependent on the processing needs. In the present case the field limiting element 18 consist of an absorptive plate being introduced into the upper part of the beam path as shown in FIG. 1.

In the further course of forming the short axis $A_s$ of the illuminating line 14 the beam 22 which exits the field limiting element 18 is imaged on a substrate 28 in the illumination plane 30 by means of a transmissive system comprising two cylindrical projection lenses 24, 26. This optical system may be a reducing optics so that a reduced image of the boundary of the field limiting element 18 is obtained, e.g. at a ratio of 10:1. Optical systems of this kind permit edge definitions down to a few μm to be achieved, depending on the optical resolution (NA) of the reducing optics. A sharp edge definition is accompanied by an excellent depth of field. Thus an edge definition of 3 μm and a depth of field of typically +/−20 μm are obtainable for a numerical aperture NA of illumination of 0.1 on the image side.

As already explained in the foregoing an optical system 2 as shown in FIGS. 1 and 2 may be used for laser annealing of thin semiconductor films being deposited on the substrate 28. In particular, the arrangement 2 may be used in order to convert an amorphous Silicon layer into a polycrystalline thin film.

In some cases, during laser annealing the substrate 28 has to be kept in a defined atmosphere, e.g. in a vacuum chamber (not shown). The laser beam 32 emitted from the reducing optics 24, 26 in this case is conducted through a protection window 34.

It has been found that due to non-uniformities of the emitted laser beam 12 itself, due to tolerances of the optical elements 16, 24, 26, 34 as well as due to misalignments and maladjustments of the optical elements 16, 24, 26, 34 with respect to each other and in particular with respect to the incoming laser beam the exit illuminating line 14 will be non-uniform in intensity. In particular there will be light beam non-uniformities which are not tolerable since the laser crystallization will lack in uniformity.

The present invention solves the problem of correcting the intensity non-uniformity of a light beam 12, particularly a high power laser beam 12 at the exit of an optical system 2, particularly a laser material processing apparatus 2, particularly an apparatus 2 for thin beam directional crystallization of silicon by a local detuning of an antireflection coating at one element of the system, for example at the protection window 36 separating the optical system 2 from the object 28 to be processed. Such a local detuning in the preferred embodiment occurs by a local removing of the material of the upper layer of an anti-reflection coating, particularly multi-layer coating, by means of ion beam etching (milling).

Figure 3:
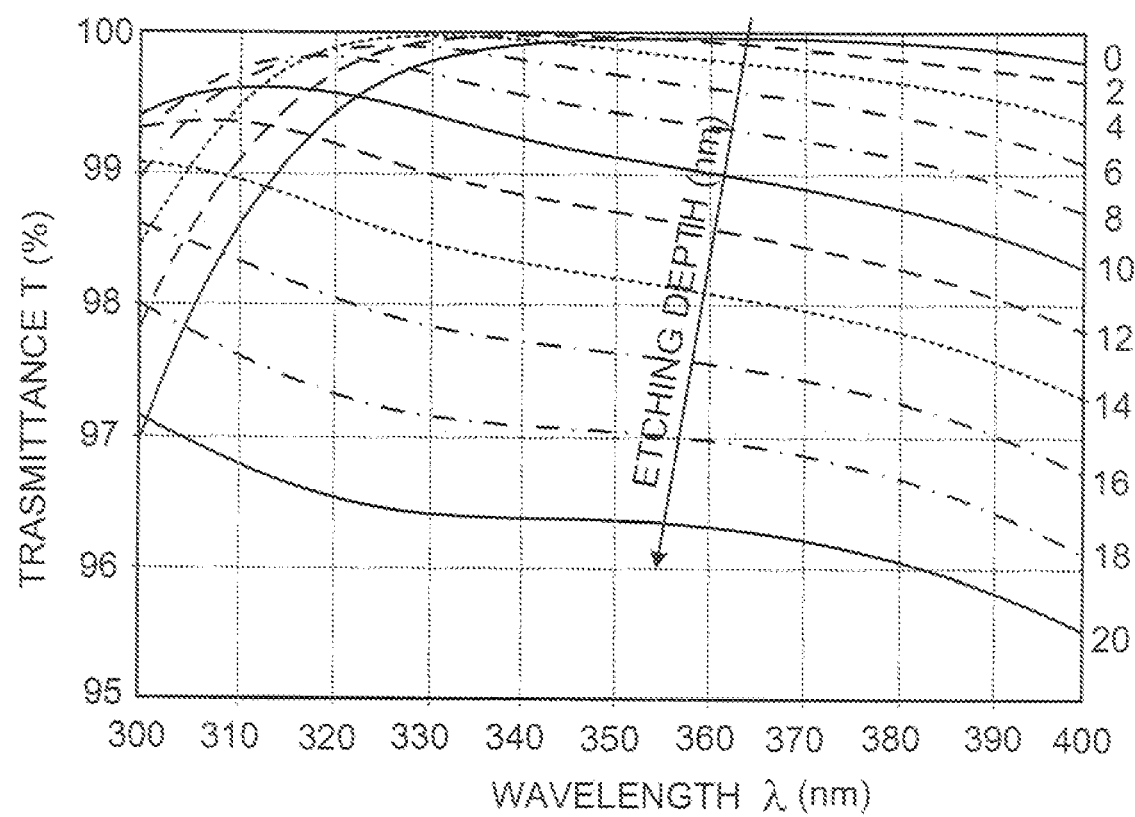
FIG. 3 is a spectral characteristics of a particular antireflection multilayer coating as a function of an etching depth of the upper layer.
Figure 4:
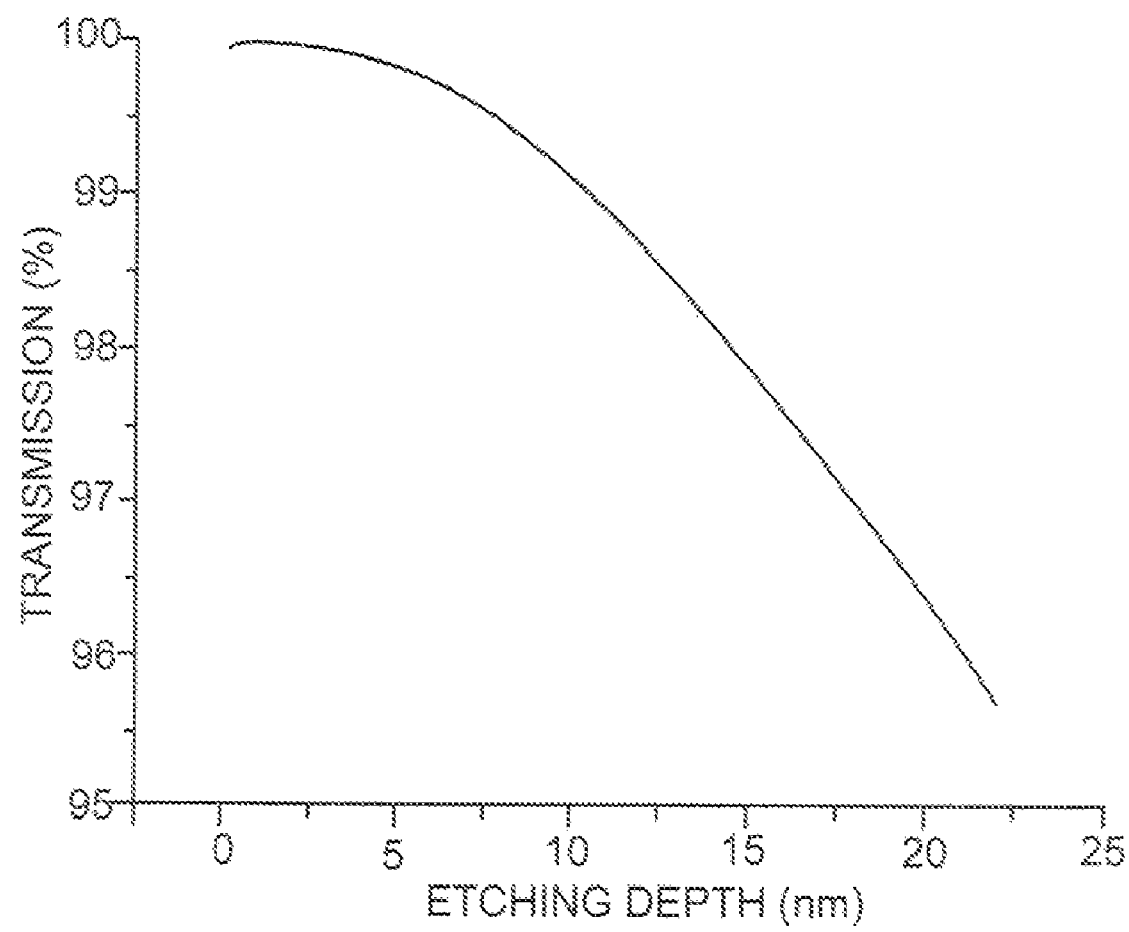
FIG. 4 is a dependence of the transmission on an etching depth as derived from FIG. 3.

In FIG. 3 spectral characteristics of a particular antireflection multilayer coating as a function of an etching depth of the upper layer is shown. From this figure a dependence of the transmission on an etching depth can be derived (FIG. 4). Despite a two-dimensional distribution of the transmission of the optical system may be measured, in general only the uniformity as a function of the long axis direction will be measured. A correction table can be calculated, which defines the etching depth of the upper layer as a function of spatial coordinates and in particular along the long axis direction in the surface plane. An ion beam figuring (IBF) apparatus can remove the material of the upper layer according to the table to correct the beam non-uniformity. In most cases it is sufficient, when the thickness along the short axis direction is not amended but along the long axis direction. The advantage of the beam non-uniformity correction by a local detuning of an antireflective coating is that no absorptive elements increasing a thermal load of the system have to be placed into the beam.

This allows to use the correction method in an apparatus 2 using a very high power laser beam 12.

Figure 5:
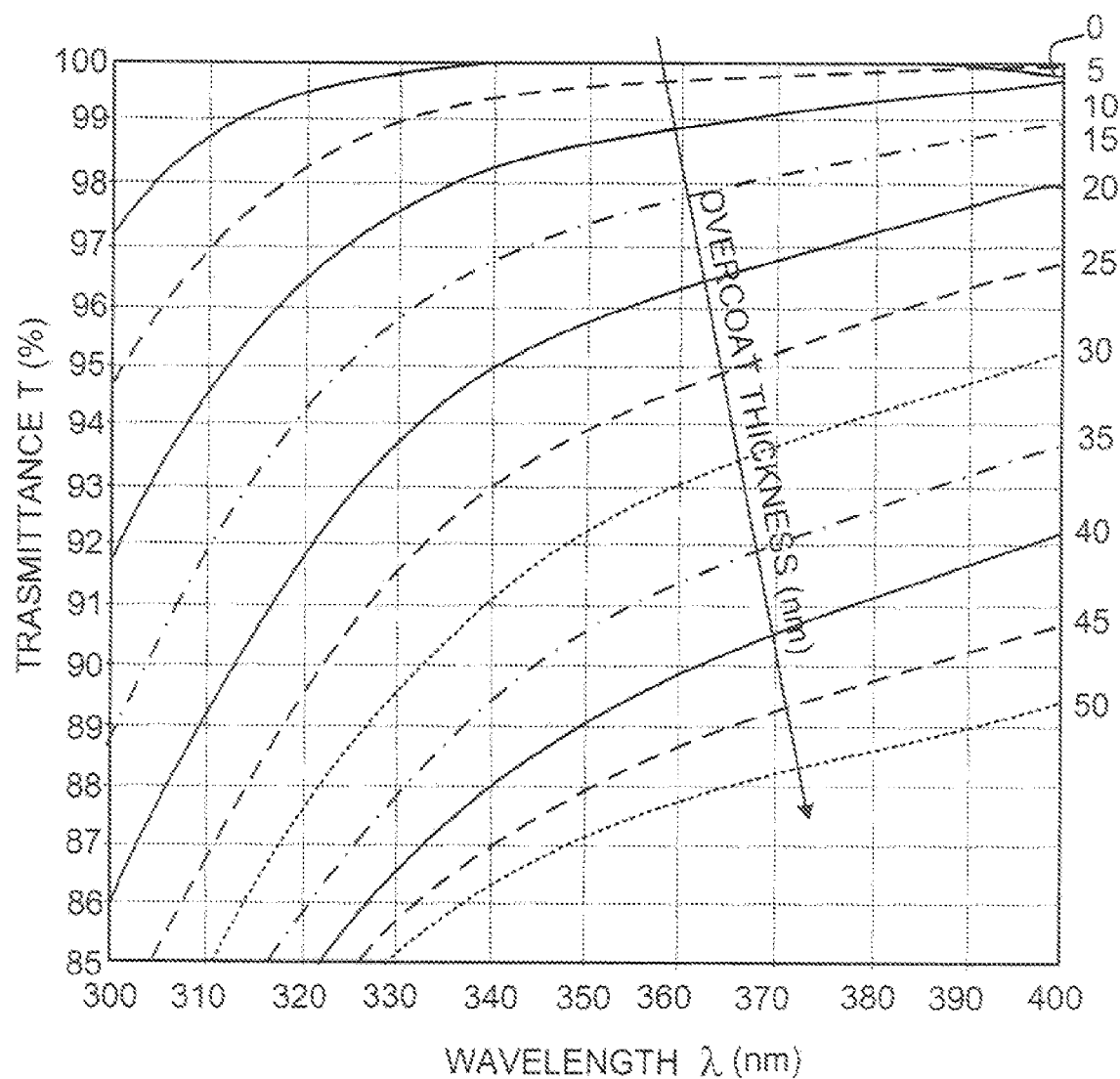
FIG. 5 is a spectral characteristics of a particular antireflection coating as a function of the overcoat thickness.

Instead of removing the antireflection coating locally also the local deposition of a respective material is possible. FIG. 5 shows a spectral characteristics of a particular antireflection coating as a function of the overcoat thickness.

The following procedure may be used for correcting non-uniformity of the laser illuminating line 14:

In a first step the optical system 2 is assembled with the optical elements 16, 24, 26, 34 being arranged in the respective predetermined positions as shown in FIGS. 1 and 2.

In a second step the intensity distribution of the illuminating line 14 is measured in or very close to the field plane 28 where the substrate is located.

In a third step the locally required increase in absorption and/or reflection of one of the optical elements, in the present case the protection window 34 is calculated (e.g. by means of a computer) in order to amend measured intensity distribution into a predetermined intensity distribution In a fourth step the protection window 34 is removed from the optical system 2.

Absorption and/or reflection of the protection window 34 in a fifth step are locally amended according to the calculation. This will be done in the present case by locally ion beam etching of the upper layer of the multi-layer anti-reflective coating the protection window 34 is covered with.

In a sixth step the protection window 34 is re-installed in the predetermined position in the optical system 2.

Figure 10:
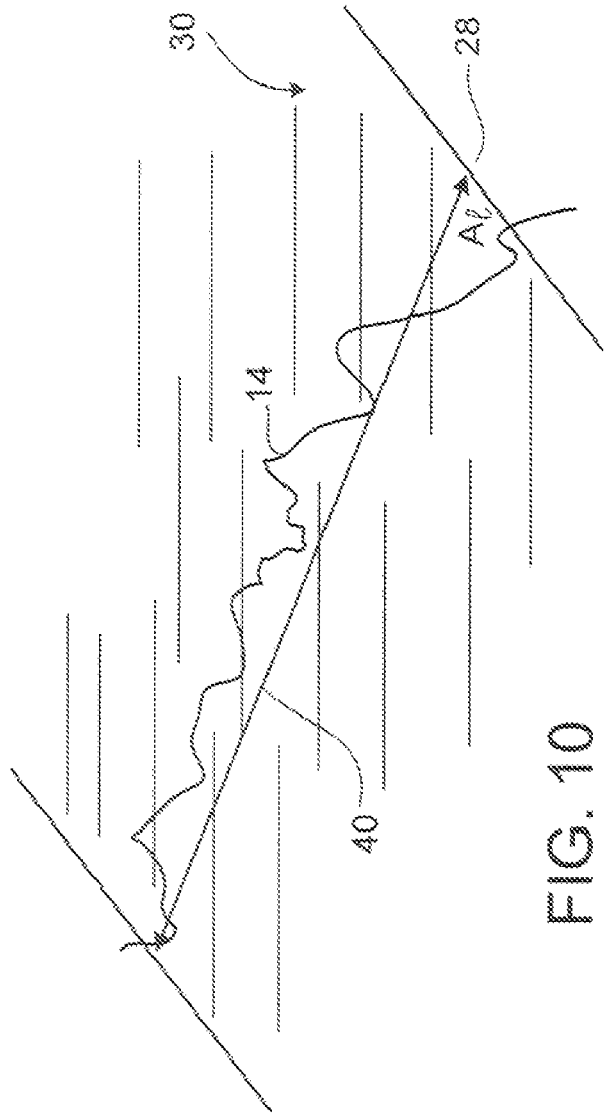
FIG. 10 the location of the focus on a panel of an illuminating line according to the prior art. The figure shows a perspective view of the line focus on the panel.
Figure 11:
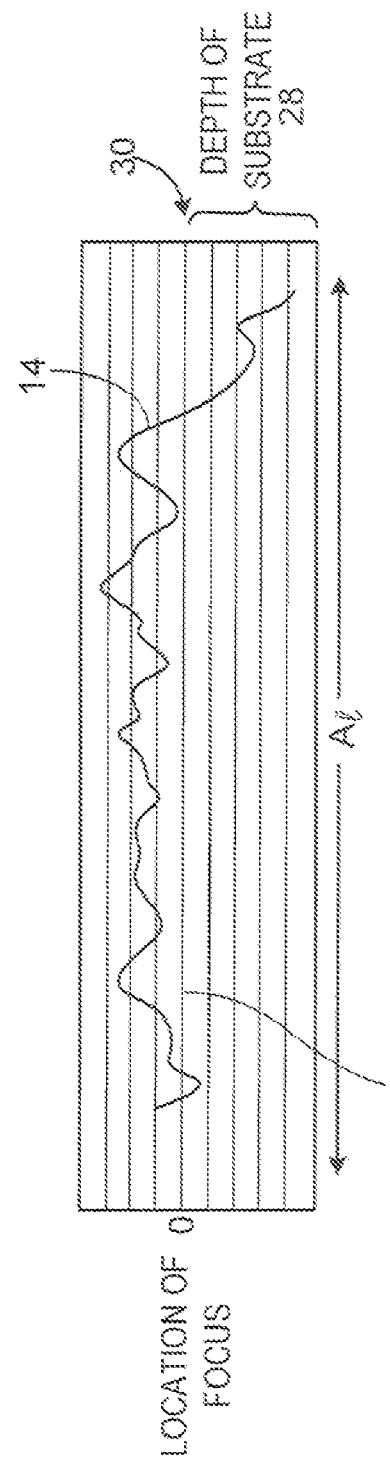
FIG. 11 is a cut through of the location of the focus according to FIG. 10 on the panel along the long beam axis.
Figure 12:
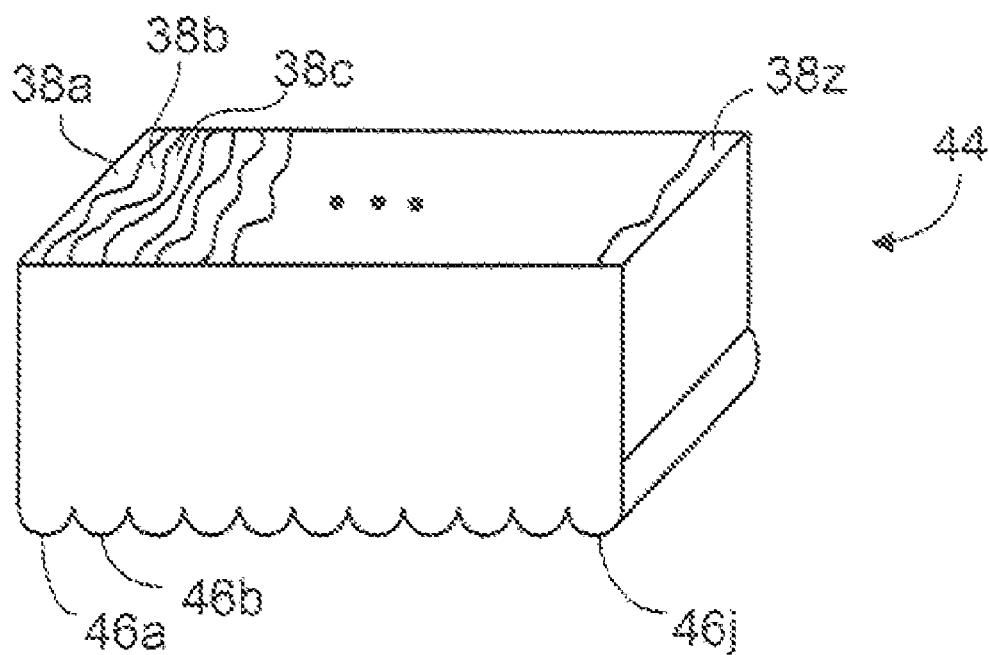
FIG. 12 is a perspective view of a line focus correction device in the form of a lens according to the invention.
Figure 13:
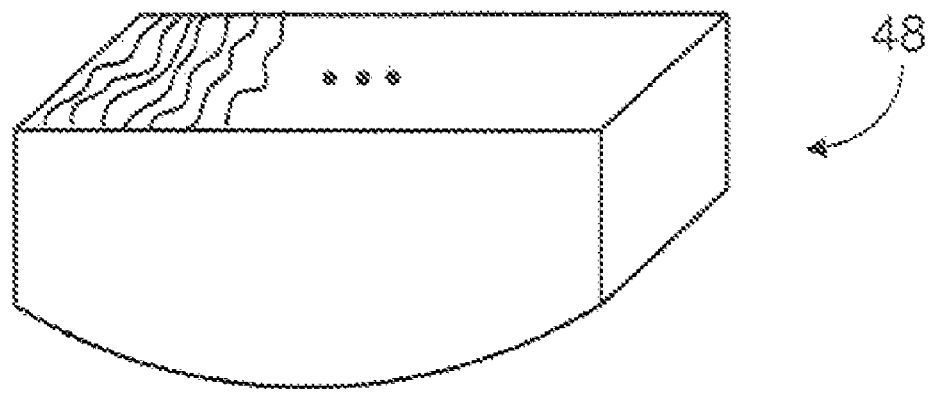
FIG. 13 is a perspective view of a line focus correction device in the form of a mirror glass plate according to the invention.

As already explained above the optical elements 16, 24, 26, 34 of the optical system 2 according to FIGS. 1 and 2 do not behave like ideal optical elements as desired. The surface figure errors do not only lead to intensity non-uniformities but also result in a line focus 14 locally deviating from a predetermined course or shape. In particular, the line focus 14 will partly be in front of the surface 30 of the substrate 28 and in some parts the line focus 14 will be inside the substrate 28 as e.g. illustrated in FIGS. 10 and 11, which show a perspective view of the location of the focus 14 on a panel 28 of an illuminating line according to the prior art and a cut through of this location 14 along the long beam axis $A_1$, respectively.

According to the invention not only an intensity correction device is introduced into the beam path but also a line focus correction device for locally correcting the line focus 14 in a predetermined manner. In the optical system 2 shown in FIGS. 1 and 2 the protection window 34 is also used as a line focus correction device which serves for the correction of the surface figure errors of the optical elements 16, 18, 24, 26 of the optical system 2 described above.

Figure 6:
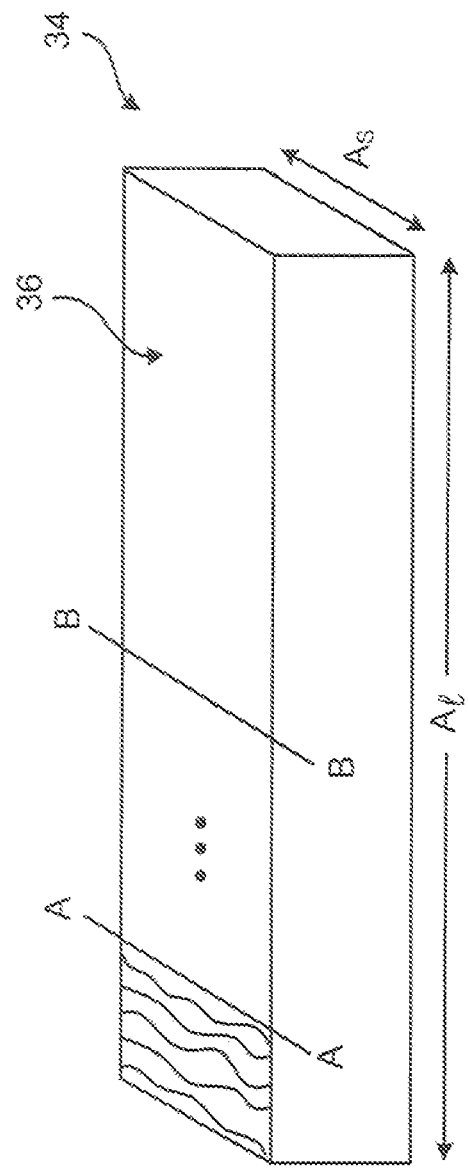
FIG. 6 is a perspective view of a line focus correction device in the form of a coplanar glass plate according to the invention.
Figure 7:
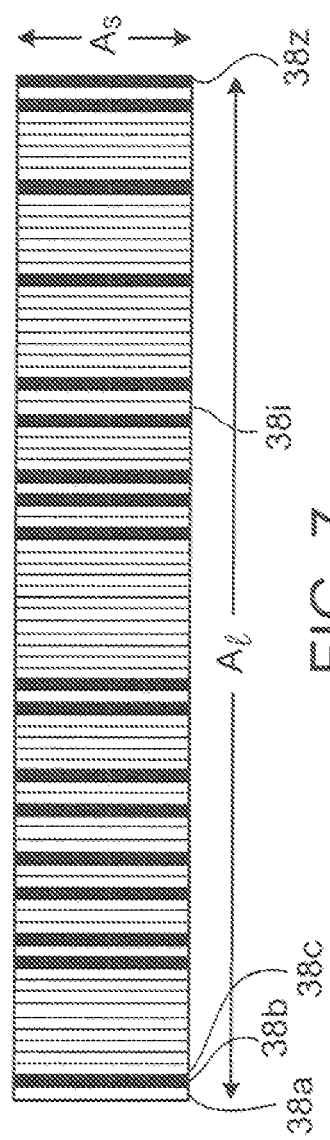
FIG. 7 is a top view of the coplanar glass plate according to FIG. 6.

According to the invention one surface 42 (here the back surface 42) of the protection window 34, which in principle consists of a coplanar glass plate 34, is locally abrasively treated forming a plurality of lenslets 38a, 38b, . . . 38i, . . . 38z (cylindrical segments) being arranged adjacent to each other along the long axis $A_1$ as e.g. shown in FIGS. 6 and 7. These lenslets 38a, 38b, . . . 38i, . . . 38z, which may be of concave type as may e.g. been demonstrated by the lenslet (cylindrical segment) of FIG. 8 or of convex type as e.g. the segment shown in FIG. 9. The surface 36 or specifically the lenslets 38a, 38b, . . . 38i, . . . 38z locally correct the line focus 14 along the long axis $A_1$ to follow a predetermined course or shape in the long axis $A_1$ direction. This predetermined course or shape may be the surface 30 of the substrate 28 (as is indicated with the position "0" or the straight line indicated with reference number 40 in FIGS. 10 and 11, respectively). In some cases the desired focus line can also be positioned within the substrate 28 (depth axis value below "0" in FIG. 11) or in front of the substrate 28 (depth axis value above "0" in FIG. 11). It is obvious for a person skilled in the art that the focus line, as desired, does not necessarily need to follow a straight line as for facility reasons has been shown in FIGS. 10 and 11. Also a curved focus line (e.g. in the xy-plane) may be predetermined dependent on the specific application the line beam is used for.

Furthermore, instead of using the bottom surface 42 of the window 34 as a surface figure error correction surface also the top surface 36 may be used. Instead of using the window 34 as a focus line correction device also a separate optical device may be used. In particular, another lens or another mirror being additionally introduced as an optical element or being already part of the optical system 2, such as e.g. lens 26 or lens 24 or one of the lenses 16, may be used as the line focus correction device.

In order to get the line focus correction device the following steps may be used:
Step 1) assembling the optical system 2 with the optical elements 16, 24, 26, 34 being arranged in predetermined positions
Step 2) measuring focus position with respect to a predetermined field plane 30 or a conjugate plane thereof.
Step 3) calculating locally required focus position correction of one of the optical elements, namely the protection window 34, in order to amend measured focus position into a predetermined focus position
Step 4) removing the protection window 34 from the optical system 2
Step 5) locally correcting properties of the protection window 34 according to the calculation
Step 6) installing the protection window 34 in the predetermined position in the optical system 2.

Steps 1), 4) and 6) may correspond to the first, fourth and sixth step, respectively. The other steps may be performed simultaneously, subsequently or intermittingly with the respective second and third step and the fifth step, respectively.

The contribution of the processing of the intensity non-uniformity correction described before to the wave front non-uniformity can be taken into account by forstalling during the wave front correction step, namely the focus correction step, before coating the correction element 34.

Another way is to coat one side of the correction element, particularly the protection window 34, with an antireflective coating, then to measure the intensity non-uniformity of the whole system and correct it by ion beam etching at the coated side. As the next step, the wave front error of the system has to be measured and corrected by ion beam etching at the uncoated side of the correction element. Finally the second side of the correction element has to be coated with an anti-reflecting coating.

It has to be again outlined that not only the protection window 34 may serve as the intensity non-uniformity correction device and/or the line focus correction device. Line focus correction and intensity error correction may be carried out by different optical elements as well as by the same optical element.

Figure 8:
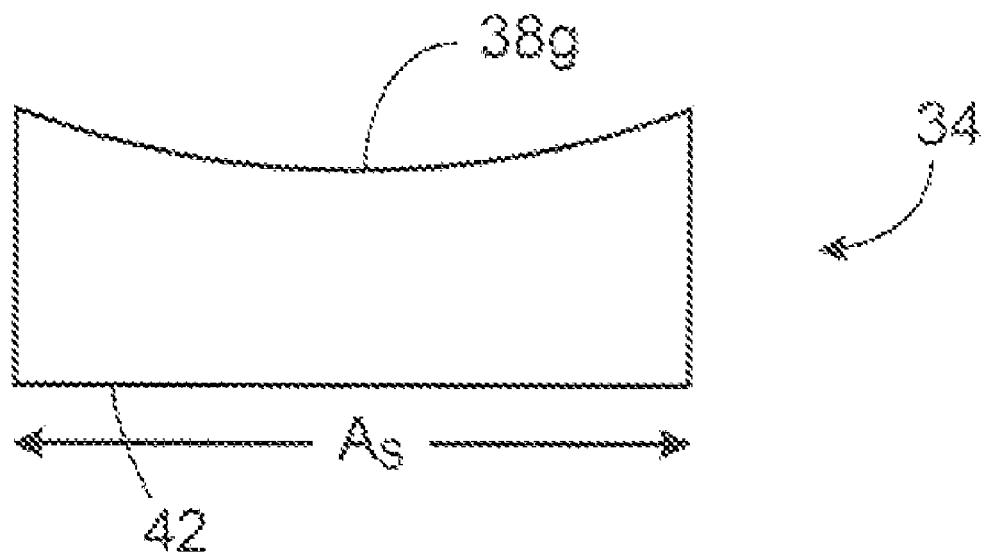
FIG. 8 is a cut along A-A of the coplanar glass plate according to FIGS. 6 and 7.

FIG. 8 shows another embodiment of a line focus correction device in the form of a lens 44 consisting of a plurality of lenslets 46a, 46b, . . . 46j used for the above described anamorphic imaging of the incoming laser beam 12 and comprising a plurality of cylindrical segments 38a, 38b, 38c, . . . 38z arranged adjacent to each other in the long axis $A_1$ direction.

Figure 9:
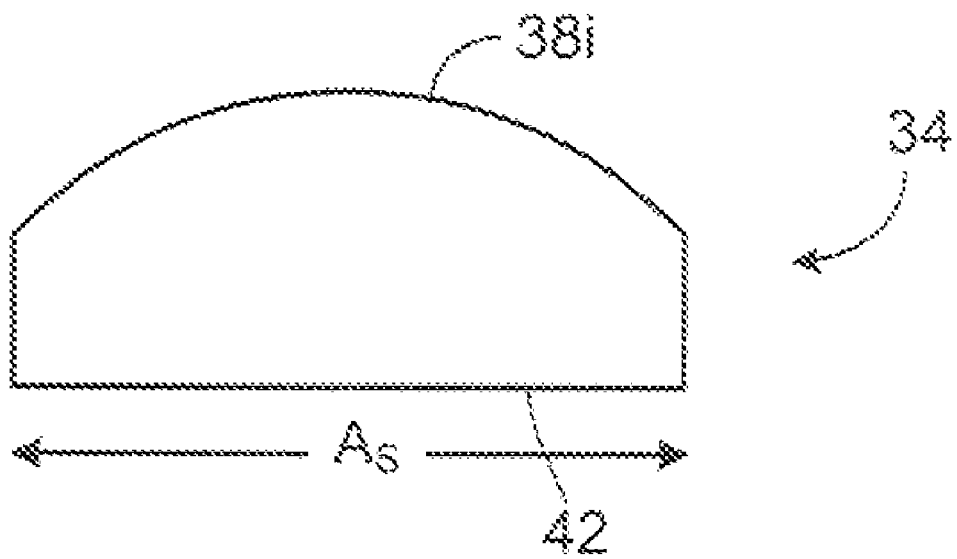
FIG. 9 is a cut along B-B of the coplanar glass plate according to FIGS. 6 and 7.

FIG. 9 shows still another embodiment of a line focus correction device in the form of a curved mirror 48 comprising a plurality of cylindrical segments 38a, 38b, 38c, . . . 38z arranged adjacent to each other in the long axis $A_1$ direction.

Preferably planar or nearly planar surfaces (e.g. a surface of a mirror or a lens having a comparably large radius) of optical devices are used in order to form the correcting surfaces. Abrasion of such surfaces is quite easy from a fabrication point of view. Furthermore, such surfaces are arranged closer to the focus line to be generated as compared with other surfaces.

A line focus correction device may be fabricated using the following steps:

Assuming that only a focus shift and herewith a focus position correction along the optical axis shall be applied, in a first step the focus position error is to be predetermined on the surface 36 of the window 34. Subsequently cylindrical segments as explained above are applied onto the surface 36 in order to correct the error. In a first case where the distance of the focus of one point along the focus line is to be enlarged a concave cylindrical lenslet is to be applied. In a second case, where the focal distance of a point along the focus line is to be reduced a convex cylindrical lenslet is to be applied. The radius of the cylindrical segment determines the absolute value of the correction. By applying of segments of aspherical cylindrical lenses not only the position of the focus line and therefore its linearity maybe influenced but also the sharpness of the imaging.

Not only partially or locally false surface contours (e.g. shapes of optical elements deviating locally or in segments or parts from a predetermined ideal shape) of the optical system may be corrected but also systematic deviations from a predetermined shape. Such a systematic deviation may be for example the so called bow tie error, namely a variation of the focal distance towards the edge of the field in the long axis $A_1$ direction. Another systematic error may be aspheric aberration or coma of the projection system. Such a correction may be done without having measured the error in advance. This is possible, when the influence of the error is determined by the geometry of the imaging system itself. Instead of cylindrical segments a continuously varying function of the cylindrical radii and aspherical constants may be used.

The application of the correction function on the correction surface may be applied with all kinds of abrasive or adding methods such as ion beam figuring (IBF), robotics polishing or magneto-rheological polishing (MRF), evaporation using specific masks or by evaporation of areas masked with a photo resist and subsequent lift-off. Furthermore, one may think of locally amending the refractive index of a transparent material for example by illuminating the material with ultraviolet light or by bombardment of the material with charged particles or by local chemical treatment of the material.

Not the complete correction may be applied to one surface area only. For example, it may be possible that one side, e.g. the front side surface, of a planar window carries the correction of a systematic error, such as for example the bow tie error, and the other side, e.g. the back side surface, of the window carries the correction of local deficiencies of the optical system. It is also possible to have correction surfaces applied to different optical elements.

The correction may also be caused by mechanical or electrical treatment of the material of the optical elements such as by mechanical leverage, piezoelectric actuators or electromechanical, electrostrictive or pneumatic actuators. Furthermore, the correction may vary in dependence of time and in dependence of other parameters in order for example to compensate ageing of optical elements or coatings or in order to compensate the thermal drift. Furthermore the mechanism may be used in order to adjust the optical system with respect to deficiencies and singularities of the substrate to be processed. For example curvature or corrugation and different heights or substrate positions may be corrected.

Furthermore, on the surface of a larger optical element, such as a window, additional corrections for different applications may be implemented. The respective areas of the correction elements to be hit by the laser beam may be amended. Different substrate geometries may be addressed. Additionally, identical correction surfaces may be implemented separately in order to produce redundance. Such redundant correction devices may be introduced into the optical path in a case where contamination or thermal load puts a risk on the correction device just used.

Transparent optical elements may be used in order to fabricate a correction device according to the invention. Instead of a transparent optical element such as a window, a lens or a prism, also reflective elements, such as a mirror, may be introduced. A transparent line focus correction device may carry an anti reflection coating. A reflective line focus correction device may carry a reflective coating.

Quartz, all kinds of glasses, crystals, such as calcium fluoride or silicon or germanium may be used for the fabrication of transparent elements, in particular in the infrared spectral range. Reflective elements may consist of Quartz, all kinds of glasses but also materials with very low expansion coefficients such as ULE or Zerodur, crystals ($CaF_2$), semiconductors (SiGe) or metals may be used. The useable spectral range may include the far infrared range as well as x-rays. Excimer lasers, solid-state lasers, diode-laser, gas lasers etc. may be used.

While the foregoing disclosure mainly focuses on certain processes and laser annealing apparatuses that are capable of carrying out such processes, the optical elements, systems and methods can be used elsewhere as well.

Other embodiments are in the claims.

The invention claimed is:

1. An anamorphic optical system comprising:
a plurality of optical elements,
wherein at least one of the optical elements is an imaging error correction device, the imaging error correction device comprising an anti-reflection film supported by a surface of the imaging error correction device, the anti-reflection film having a locally varying anti-reflective property, and where the plurality of optical elements are configured so that during operation the anamorphic optical system generates an illuminating line on a surface.

2. The anamorphic optical system according to claim 1, wherein the imaging error correction device comprises a wave front correction device.

3. The anamorphic optical system according to claim 1, wherein the imaging error correction device comprises a surface figure error correction device.

4. The anamorphic optical system according to claim 1, wherein the imaging error correction device comprises a light beam intensity non-uniformity correction device that comprises the anti-reflection film.

5. The anamorphic optical system according to claim 1, wherein the imaging error correction device comprises a line focus correction device.

6. A scanning system comprising:
a plurality of optical elements,
wherein at least one of the optical elements is an imaging error correction device, the imaging error correction device comprising an anti-reflection film supported by a surface of the imaging correction device, the anti-reflection film having a locally varying anti-reflective property, and where the plurality of optical elements are configured so that during operation the scanning system generates a scanning illumination line on a surface.

7. The scanning system according to claim 6, wherein the imaging error correction device comprises a wave front correction device.

8. The scanning system according to claim 6, wherein the imaging error correction device comprises a surface figure error correction device.

9. The scanning system according to claim 6, wherein the imaging error correction device comprises a light beam intensity non-uniformity correction device that comprises the anti-reflection film.

10. The scanning system according to claim 6, wherein the imaging error correction device comprises a line focus correction device.

11. The anamorphic optical system according to claim 1, wherein the at least one optical element is a transparent optical element.

12. The anamorphic optical system according to claim 11, wherein the anti-reflection film is a coating forming a light entrance face of the transparent optical element.

13. The anamorphic optical system according to claim 1, wherein the anti-reflection film varies locally in thickness.

14. The anamorphic optical system according to claim 1, wherein the anti-reflection film comprising a plurality of layers.

15. The anamorphic optical system according to claim 14, wherein the outer layer of the plurality of layers is locally at least partly removed.

16. The anamorphic optical system according to claim 1, wherein the at least one optical element is a cylindrical lens or a plane window or a cylindrical mirror.

17. The scanning system according to claim 6, wherein the at least one optical element is a transparent optical element.

18. The scanning system according to claim 17, wherein the anti-reflection film is a coating forming a light entrance face of the transparent optical element.

19. The scanning system according to claim 6, wherein the anti-reflection film varies locally in thickness.

20. The scanning system according to claim 6, wherein the anti-reflection film comprising a plurality of layers.

21. The scanning system according to claim 20, wherein the outer layer of the plurality of layers is locally at least partly removed.

22. The scanning system according to claim 6, wherein the at least one optical element is a cylindrical lens or a plane window or a cylindrical mirror.

* * * * *